United States Patent
Hirayama et al.

(10) Patent No.: US 12,121,963 B2
(45) Date of Patent: Oct. 22, 2024

(54) METASTABLE SINGLE-CRYSTAL RARE EARTH MAGNET FINE POWDER AND METHOD FOR PRODUCING SAME

(71) Applicant: NATIONAL INSTITUTE OF ADVANCED INDUSTRIAL SCIENCE AND TECHNOLOGY, Tokyo (JP)

(72) Inventors: Yusuke Hirayama, Aichi (JP); Akihide Hosokawa, Aichi (JP); Kenta Takagi, Aichi (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 269 days.

(21) Appl. No.: 17/438,690

(22) PCT Filed: Mar. 13, 2020

(86) PCT No.: PCT/JP2020/011285
§ 371 (c)(1),
(2) Date: Sep. 13, 2021

(87) PCT Pub. No.: WO2020/184724
PCT Pub. Date: Sep. 17, 2020

(65) Prior Publication Data
US 2022/0148771 A1    May 12, 2022

(30) Foreign Application Priority Data

Mar. 14, 2019  (JP) ................. 2019-047628

(51) Int. Cl.
B22F 1/054    (2022.01)
C30B 23/00    (2006.01)
(Continued)

(52) U.S. Cl.
CPC .............. B22F 1/054 (2022.01); C30B 23/00 (2013.01); C30B 29/52 (2013.01); C30B 29/60 (2013.01);
(Continued)

(58) Field of Classification Search
CPC ........ B22F 1/054; H01F 1/059; H01F 1/0551; C30B 29/52
See application file for complete search history.

(56) References Cited

U.S. PATENT DOCUMENTS

2007/0227624 A1* 10/2007 Hattori ................... G11B 5/714

FOREIGN PATENT DOCUMENTS

CN   107552805 A  *  1/2018 ............... B22F 1/00
JP   05251221 A  *  9/1993
(Continued)

OTHER PUBLICATIONS

JP 2017-055072 machine translation (Year: 2017).*
(Continued)

*Primary Examiner* — Paul A Wartalowicz
*Assistant Examiner* — Stephani Hill
(74) *Attorney, Agent, or Firm* — WENDEROTH, LIND & PONACK, L.L.P.

(57) ABSTRACT

A single crystal particle powder having a crystal structure of $TbCu_7$-type of the present invention is represented by the general formula:

[Chemical Formula 1]

$$(R_{1-z}M_z)T_x \quad (1)$$

or the general formula:

[Chemical Formula 2]

$$(R_{1-z}M_z)T_xN_y \quad (2)$$

and has a crystal structure of $TbCu_7$-type,
(Continued)

wherein R is at least one element selected from the group consisting of Sm and Nd, T is at least one element selected from the group consisting of Fe and Co, x is $7.0 \leq x \leq 10.0$, y is $1.0 \leq y \leq 2.0$, and z is $0.0 \leq z \leq 0.3$.

9 Claims, 6 Drawing Sheets

(51) Int. Cl.
    *C30B 29/52*     (2006.01)
    *C30B 29/60*     (2006.01)
    *H01F 1/055*     (2006.01)
    *H01F 1/059*     (2006.01)
    *H01F 7/02*     (2006.01)

(52) U.S. Cl.
    CPC ........... *H01F 1/0551* (2013.01); *H01F 1/059* (2013.01); *H01F 7/02* (2013.01); *B22F 2301/155* (2013.01); *B22F 2301/355* (2013.01); *C22C 2202/02* (2013.01)

(56) References Cited

FOREIGN PATENT DOCUMENTS

| | | | |
|---|---|---|---|
| JP | 2017-55072 | 3/2017 | |
| WO | WO-2013107713 A1 * | 7/2013 | ............... C22C 1/02 |

OTHER PUBLICATIONS

Tang et al. Nanocrystalline Sm12.5(Co,Zr)87.5 magnets: synthesis and magnetic properties. Journal of Magnetism and Magnetic Materials 241 (2002) 345-356. (Year: 2002).*
CN 107552805 machine translation (Year: 2018).*
Luo et al. Phase and microstructure of TbCu7-type SmFe melt-spun powders. Journal of Rare Earths, vol. 31, No. 4, Apr. 2013, p. 381-385. (Year: 2013).*
Mao et al. Metastable RFe7 compounds (R=rare earths) and their nitrides with TbCu7 structure. J. Appl. Phys. 79 (8), Apr. 15, 1996, 4605-4607. (Year: 1996).*
Hirayama et al. Anisotropic Nd—Fe ultrafine particles with stable and metastable phases prepared by induction thermal plasma. Journal of Alloys and Compounds 873 (2021) 159724. Available online Mar. 31, 2021. (Year: 2021).*
Takagi et al. Preparation of TbCu7-type Sm—Fe powders by low-temperature HDDR treatment. Journal of Magnetism and Magnetic Materials 454 (2018) 170-175. Available online Feb. 1, 2018. (Year: 2018).*
Pan et al. Bulk nanocrystalline SmCo7-xFex sintered magnets prepared by spark plasma sintering. Xiyou Jinshu Cailiao Yu Gongcheng (2009), 38(1), 161-163. STN Abstract. (Year: 2009).*
Ivanova et al. Structure and magnetic properties of the new ternary compound Sm(Fe,Ti)8.5 Fizika Metallov I Metallovedenie (1994), 78(2), 60-5. (Year: 1994).*
International Search Report issued Jun. 2, 2020 in International (PCT) Application No. PCT/JP2020/011285.

* cited by examiner

US 12,121,963 B2

METASTABLE SINGLE-CRYSTAL RARE EARTH MAGNET FINE POWDER AND METHOD FOR PRODUCING SAME

TECHNICAL FIELD

The present invention relates to a rare earth anisotropic magnet material and a rare earth magnet material suitable for use in a permanent magnet with high characteristics, which are suitable for use in a wide range of fields such as electronics, information communication, medical, machine tool fields, and industrial and automobile motors.

BACKGROUND ART

The magnetic compound currently used for the magnet with the highest performance is an $Nd_2Fe_{14}B$ compound. This magnet has the main phase of the Nd—Fe—B magnet invented in 1982, the crystal structure thereof has been determined in 1984, and is currently utilized as the strongest permanent magnet material.

Whereas, there has been reported a compound having a potential exceeding $Nd_2Fe_{14}B$ that is the main phase of the NdFeB magnet.

$(SmZr)(FeCo)_{10}N_x$ having a $TbCu_7$-type structure shows anisotropy comparable to that of $Nd_2Fe_{14}B$, and a value of saturation magnetization higher by about 10% than that of $Nd_2Fe_{14}B$ (refer to Non-Patent Literature 1).

Furthermore, the this compound is known to be a metastable phase, and the preparation method is limited. For example, for a compound of Sm or Nd and Fe having a $TbCu_7$-type structure, powder synthesis has been successful only by a liquid quenching method, a mechanical alloying method, or an HDDR method. (Refer to Non-Patent Literatures 2 and 3 and Patent Literature 1).

However, in these processes, only an isotropic sample having no crystal orientation (i.e. poly crystalline) can be obtained, and there is no example of a report in which an anisotropic magnet that maximizes the potential of the compound can be prepared. Both the report by Sakurada et al. (Non-Patent Literature 1) and the report by Takagi et al. (Patent Literature 1) relate to isotropic samples, and have not achieved synthesis of a single crystal powder as a raw material that can be a high-performance magnet material, or a powder with aligned crystal directions.

For example, in the case of the Nd—Fe—B magnet, it has been reported that an isotropic powder as the raw material powder is subjected to a hot working treatment or an HDDR treatment to provide a powder or a molded magnet with aligned crystal directions (refer to Patent Literatures 2 and 3); however, crystals are not aligned when the same treatment is performed for Sn—Fe, Nd—Fe, Sr—Fe—N, or Nd—FeN based magnet materials.

Currently, the only method capable of obtaining a sample having crystal orientation is a sputtering method. However, the sputtering method takes much time and cost to provide a powder, and is not realistic as a method for synthesizing a powder. (Refer to Non-Patent Literature 4).

Therefore, there has been no report so far on an example of obtaining a single crystal powder having a $TbCu_7$-type structure as a raw material of an anisotropic magnet having a high potential, and thus there has been a problem of no alternative of the neodymium magnet having $Nd_2Fe_{14}B$ as a main phase.

CITATION LIST

Patent Literatures

Patent Literature 1: JP 2015-5550 A
Patent Literature 2: JP 11-329810A
Patent Literature 3: JP 2012-199482 A

Non-Patent Literatures

Non-Patent Literature 1: S. Sakurada et al., Journal of Applied physics, 79 (1996) 4611.
Non-Patent Literature 2: Kai-Ying Wang et al., Solid state Communications, 88 (1993) 521.
Non-Patent Literature 3: H. Nakamura et al., Materials Chemistry and Physics, 32 (1992) 280.
Non-Patent Literature 4: T. Kusumori et al., Applied Physics Express 9, 043001 (2018)

SUMMARY OF INVENTION

Technical Problem

In view of the above problem, an object of the present invention is to achieve synthesis of a single crystal powder having a $TbCu_7$-type structure as a metastable phase and an average particle size of 30 to 300 nm.

Solution to Problem

As a result of intensive investigation to solve the above problem, the present inventor has found that a single crystal powder having an average particle size of 30 to 300 nm and having a $TbCu_7$-type structure as a metastable phase is obtained in the process of temporarily converting a raw material metal into a gas phase by increasing the temperature and then cooling to room temperature, and has completed the present invention.

The present invention provides a single crystal powder that is represented by $(R_{1-z}M_z)T_x$ and $(R_{1-z}M_z)T_xN_y$, having a crystal structure of $TbCu_7$-type, and having an average particle size of 30 to 300 nm, wherein R is at least one element selected from the group consisting of Nd and Sm, M is at least one element selected from the group consisting of Zr, Y, and Ce, T is at least one element selected from the group consisting of Fe and Co, x is $7.0 \leq x \leq 10.0$, y is $1.0 \leq y \leq 2.0$, and z is $0.0 \leq z \leq 0.3$.

Furthermore, the present invention provides a production method, including synthesis of a single crystal powder of $(R_{1-z}M_z)T_x$ obtained in the process of mixing a mixed powder or an alloy powder of at least one element of Sm and Nd, at least one element of Zr, Y, and Ce, and at least one element of Fe and Co, converting the raw material powder into a gas phase by increasing the temperature thereof, and then cooling to room temperature, wherein R is at least one element selected from the group consisting of Nd and Sm, M is at least one element selected from the group consisting of Zr, Y, and Ce, T is at least one element selected from the group consisting of Fe and Co, x is $7.0 \leq x \leq 10.0$, and z is $0.0 \leq z \leq 0.3$.

Furthermore, the present invention provides a production method, including: obtaining a single crystal powder of $(R_{1-z}M_z)T_x$ in the process of mixing a mixed powder or an alloy powder of at least one element of Sm and Nd, at least one element of Zr, Y, and Ce, and at least one element of Fe and Co, temporarily converting a raw material metal into a gas phase by increasing the temperature thereof, and then cooling to room temperature, wherein R is at least one element selected from the group consisting of Nd and Sm, M is at least one element selected from the group consisting of Zr, Y, and Ce, T is at least one element selected from the group consisting of Fe and Co, x is 7.0≤x≤10.0, and z is 0.0≤z≤0.3; and then synthesizing a single crystal powder of $(R_{1-z}M_z)T_xN_y$ by penetrating nitrogen atoms in the range of 200° C. to 600° C., wherein R is at least one element selected from the group consisting of Nd and Sm, M is at least one element selected from the group consisting of Zr, Y, and Ce, T is at least one element selected from the group consisting of Fe and Co, x is 7.0≤x≤10.0, y is 1.05≤y≤2.0, and z is 0.0≤z×0.3.

Advantageous Effects of Invention

The present invention can provide a single crystal particle or powder having a metastable $TbCu_7$-type structure.

The method for synthesizing a single crystal powder material according to the present invention can provide a method capable of synthesizing single crystal magnetic material particles or powder in the process of temporarily converting a raw material metal into a gas phase by increasing the temperature thereof and then cooling to room temperature.

DESCRIPTION OF EMBODIMENTS

Hereinafter, embodiments of the present invention will be described.

Figure 1:
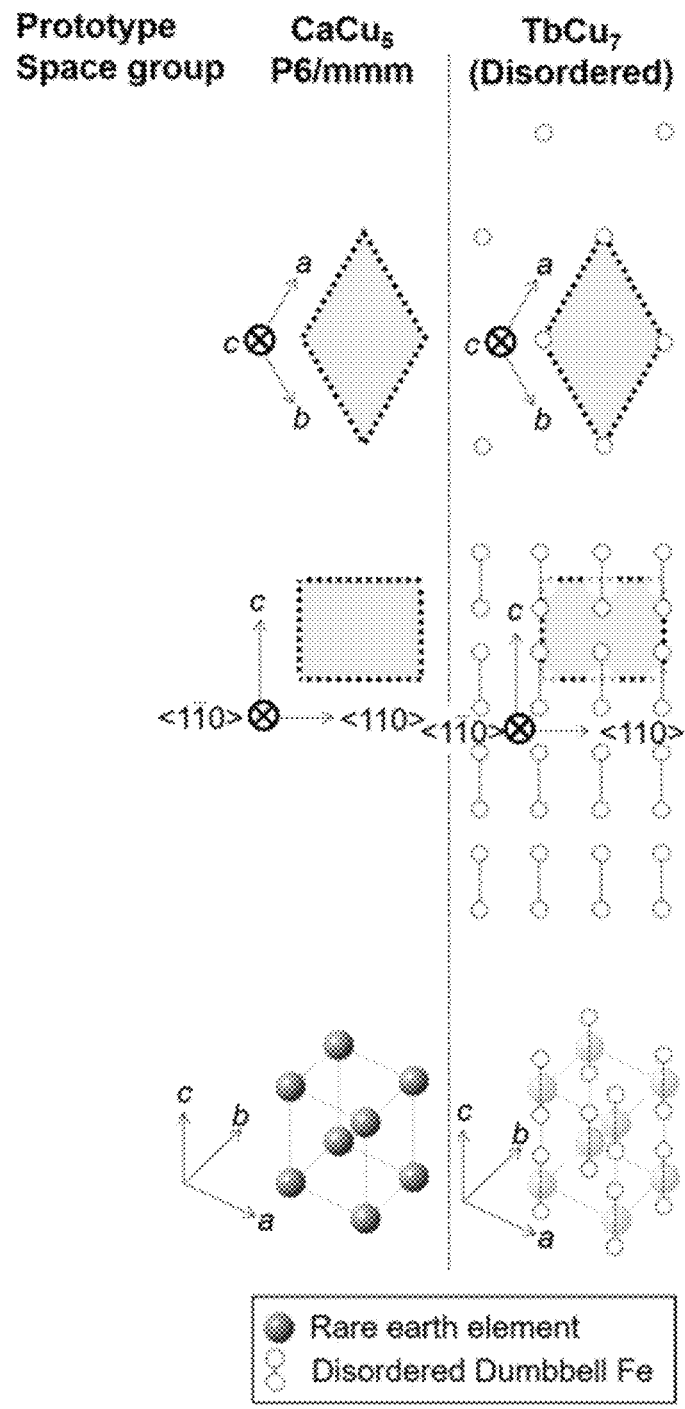
FIG. 1 is a schematic view of a $CaCu_5$ structure and a $TbCu_7$-type structure.

A R—Fe-based binary compound having a high Fe concentration includes many crystal phases based on a $CaCu_5$ structure. Each crystal structure is obtained by replacing the rare earth element at the Ca site of the basic $CaCu_5$ structure with a pair of iron, so-called "dumbbell iron: Fe—Fe". A $TbCu_7$-type structure is a structure in which the rare earth and dumbbell iron are randomly replaced, and therefore the content of Fe or Co can have a range of 87.50 to 90.91 at % with respect to the rare earth element (refer to FIG. 1).

The "metastable crystal structure" in the present invention is a crystal structure of a metastable phase, and the "metastable phase" is a phase that does not appear in a phase diagram and is unstable in terms of thermal equilibrium. For example, in the case of a binary alloy of Sm—Fe, a compound having a $ThMn_{12}$ structure, a $TbCu_7$-type structure, or a $CaCu_5$ structure is known as a metastable phase.

The "single crystal particle" in the present invention refers to a particle in which the direction of the crystal axis does not change at any position in the particle. However, it is difficult to completely prevent the oxidation of the particle surface, and therefore the target particle is determined to be a single crystal particle when the oxide layer on the particle surface is present.

The "single crystal powder" in the present invention is a state in which there are many "single crystal particles" described above without being in a polycrystalline state.

In the present invention, the "$TbCu_7$-type single crystal" is comprehensively determined by using composition analysis by a powder X-ray diffraction method (hereinafter referred to as XRD) and an energy dispersive X-ray spectroscopy method (hereinafter referred to as EDX), and an electron beam diffraction method. This is because the single crystal or the polycrystal cannot be distinguished only from the XRD, and it is significantly difficult to distinguish from other stable phases such as $Th_2Zn_{17}$ only from the electron beam diffraction pattern. Therefore, specifically, the XRD result confirms that the alloy phase of R and Fe has only the $TbCu_7$-type structure, furthermore, the EDX measurement confirms that x of $(R_{1-z}M_z)T_x$ is 7.0≤x≤10.0, and when the electron diffraction pattern of the particle confirmed by the EDX measurement matches $TbCu_7$-type, the particle can be determined to have the $TbCu_7$-type structure. Neutron diffraction instead of X-ray diffraction may be used to identify the crystal structure.

The method for determining "$TbCu_7$-type single crystal" in the present invention can be performed not only by the above method but also by extracting one particle and performing crystal structure analysis while randomly changing the orientation.

The term "uniaxial anisotropy" refers to a magnetic property of a magnetic body that is easily magnetized in a certain crystal axis direction, and refers to a case where the direction is one direction. This uniaxial anisotropy is required for a permanent magnet material having high energy.

The "Stevens factor" is a physical quantity related to the charge density (shape) of 4f electrons in the inner shell of the rare earth element. When this is negative, the shape is contracted with respect to the symmetry axis, and when this is positive, the shape is extended from the spherical symmetry. The 4f electron cloud receives a crystal field from surrounding ions and the stable direction thereof is determined, and therefore the shape of the electron cloud determines the direction of magnetic anisotropy.

The rare earth magnet is a material obtained by combining a large magnetocrystalline anisotropy exhibited by a rare earth element and excellent properties such as high magnetization and high Curie temperature exhibited by an iron group transition metal, and is an excellent industrial material that cannot be easily replaced although alternative research on rare earth elements is advanced. The rare earth elements that control the magnetocrystalline anisotropy are divided into Nd having a spatial distribution of 4f electrons that is flat with respect to the quantization axis of the total angular momentum of 4f electrons (that is, having negative Stevens factor) and Sm having a spatial distribution of 4f electrons that extends along the quantization axis (that is, having positive Stevens factor).

An alloy of a rare earth having a $TbCu_7$-type structure and an iron group transition metal may have uniaxial anisotropy regardless of whether the Stevens factor is positive or negative due to the above-described structure in which dumbbell iron randomly enters. Furthermore, when nitriding is performed, the effect of the compound having uniaxial anisotropy can be eliminated, and the effect of having uniaxial anisotropy can be obtained for the compound having no uniaxial anisotropy. Therefore, both of the compounds $(R_{1-z}M_z)T_x$ and $(R_{1-z}M_z)T_xN_y$ of the present invention can be used as permanent magnet materials having uniaxial anisotropy, wherein R is at least one element selected from the group consisting of Nd and Sm, M is at least one element selected from the group consisting of Zr, Y, and Ce, T is at least one element selected from the group consisting of Fe and Co, x is 7.0≤x≤10.0, y is 1.0≤y≤2.0, and z is 0.0≤z≤0.3.

Furthermore, it has been reported that an effect of stabilizing the crystal structure and an effect of increasing magnetization when the R site of the $TbCu_7$-type structure is substituted with an M element (M is Zr, Y, and Ce) to some extent, and it is reasonable to use a compound containing an M element in the present invention. However, when the content of M is too large, the performance as a permanent magnet is deteriorated, and thus, in the present invention, the replacement amount is defined to be up to 30%.

The term "average particle size" in the present invention means that when 300 or more particles are randomly selected, and a histogram of particle sizes is prepared when the longest size is determined to be the particle size of the particles from an external appearance image of the particles, and the average particle size is a value fitted to a log-normal distribution function represented by the following formula:

$$1/\sqrt{2\pi}\,\theta x\, \exp(-(\ln x - \mu)^2/2\theta^2)$$ [Mathematical Formula 1]

and represented by the following formula:

$$e^{\mu + \theta^2/2}$$ [Mathematical Formula 2]

θ and μ are constants. Herein, in the laser diffraction method, a so-called secondary particle size with clusters formed is also measured, and thus it is different in meaning from the average particle size in the present invention. In addition, the average value of the particle sizes obtained from the cross-sectional image tends to be smaller than the average value of the particle sizes obtained from the external appearance image, and therefore this is also different from the average particle size in the present invention.

The single crystal particle or powder represented by the general formula of the present invention: $(R_zM_{1-z})T_x$ and $RT_xN_y$ has a crystal structure of $TbCu_7$-type, wherein R is at least one element selected from the group consisting of Sm and Nd, M is at least one element selected from the group consisting of Zr, Y, and Ce, T is at least one element selected from the group consisting of Fe and Co, x is 7.0≤x≤10.0, y is 1.0≤y≤2.0, and 0.0≤z≤0.3. However, elements of Na, Al, Mn, V, Cr, Ni, Cu, La, Pr, Hf, and Mo are included as slight impurities of 0.0 to 1.0 at % or less in addition to the above elements, and cannot be excluded due to the limit of the purity of the raw material. Therefore, it is reasonable that the inclusion thereof is within the scope of the present invention.

The single crystal particle of the present invention can be synthesized as follows.

(1) Method for Synthesizing Single Crystal Material

A mixed powder or an alloy powder of at least one element of Sm and Nd, at least one element of Zr, Y, and Ce, and at least one element of Fe and Co is used as a raw material powder, and is temporarily brought into a gas phase by increasing the temperature of the raw material metal, and then cooled to room temperature. The raw material powder may be a hydride of the metal.

The method for evaporating the raw material powder is not particularly limited, and examples thereof include an RF thermal plasma method, a direct current arc discharge method, or an arc plasma method.

Thereafter, the temperature is lowered to room temperature in an inert gas atmosphere, for example, an argon or helium atmosphere, whereby single crystal particles or powder can be produced.

The powder recovery is performed under an inert gas atmosphere, for example, an argon or helium atmosphere having an oxygen concentration of 100 ppm or less, preferably an oxygen concentration of 10 ppm.

When the temperature of the obtained single crystal material powder is less than 700° C. for $NdFe_x$ and less than 800° C. for $SmFe_x$, the $TbCu_7$-type structure is stable although heat treatment for promoting crystallization is performed.

(2) Method for Synthesizing Single Crystal Material by Nitrization

The obtained single crystal material is subjected to, for example, a heat treatment at 200 to 800° C., preferably 350 to 450° C., for 10 to 600 minutes in a nitrogen atmosphere, ammonia, a mixed gas of ammonia and hydrogen, or a mixed gas atmosphere of ammonia and nitrogen, whereby y of the general formula: $RT_xN_y$ is in the range of 1.0≤y≤2.0, and thus a single crystal material can be obtained.

The fact that y falls within the range of 1.0≤y≤2.0 is determined from the expansion coefficient of the volume of the unit cell calculated from XRD. When the unit cell volume has an expansion rate of 4% to 7% with respect to the expansion rate before nitrogen is introduced, it is determined that y is within the range of 1.0≤y≤2.0.

Hereinafter, examples will be described in more detail. Of course, the present invention is not limited by the following examples.

EXAMPLES

Example 1

Nd powder was prepared by a known gas atomization method, and then classified with a sieve of mesh #500. Nd having an average particle size of 21 μm calculated by a laser diffraction method and Fe having an average particle size of 3 μm purchased from Kojundo Chemical Laboratory were mixed at an atomic ratio of 2:3, and the mixed powder was used as a raw material powder.

Figure 2:
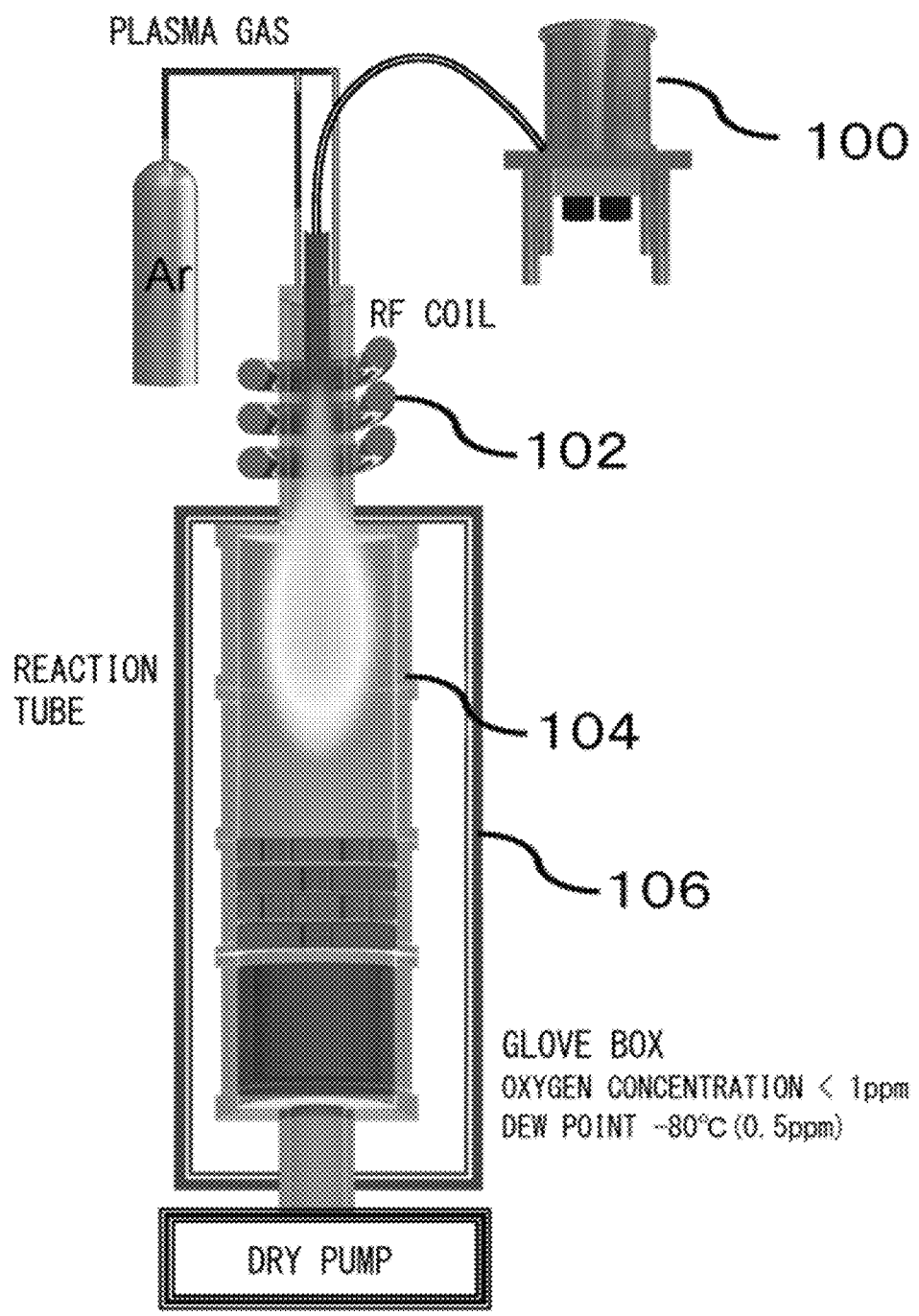
FIG. 2 is a schematic view of a thermal plasma system used in the present invention.

FIG. 2 is a schematic view of a thermal plasma system. Using TP-40020NPS manufactured by JEOL Ltd., an input power of 6 kW and a frequency of 13.56 MHz were applied to a plasma generation coil (FIG. 2, 102); thermal plasma was generated in an upper part of a chamber controlled at 100 kPa while flowing Ar of a G1 grade at 35 L/min; a powder was fed at a feed rate of about 0.3 g/min by using a powder feeder (FIG. 2, 100) TP-99010FDR manufactured by JEOL Ltd.; the powder was introduced into the generated thermal plasma to convert the raw material powder into a gas phase at a high temperature; and in a process of cooling the raw material powder to room temperature in a lower part of the chamber (FIG. 2, 104), a single crystal powder having a TbCu$_7$-type structure characterized in FIGS. 3, 4, and 5 and an average particle size of about 100 nm was obtained.

Thereafter, the powder obtained described above was recovered in a glove box (FIG. 2, 106) controlled to have an oxygen concentration of about 0.5 ppm and a dew point of −82° C., and oxidation of the powder was prevented as much as possible, and the following evaluation was performed.

XRD was performed at 14 KeV incident energy with BL5S2 of the Aichi Synchrotron Radiation Center. The sample was filled in a quartz capillary having a diameter of 300 μm in a glove box, and sealed with an epoxy resin to prevent oxidation.

Figure 3:
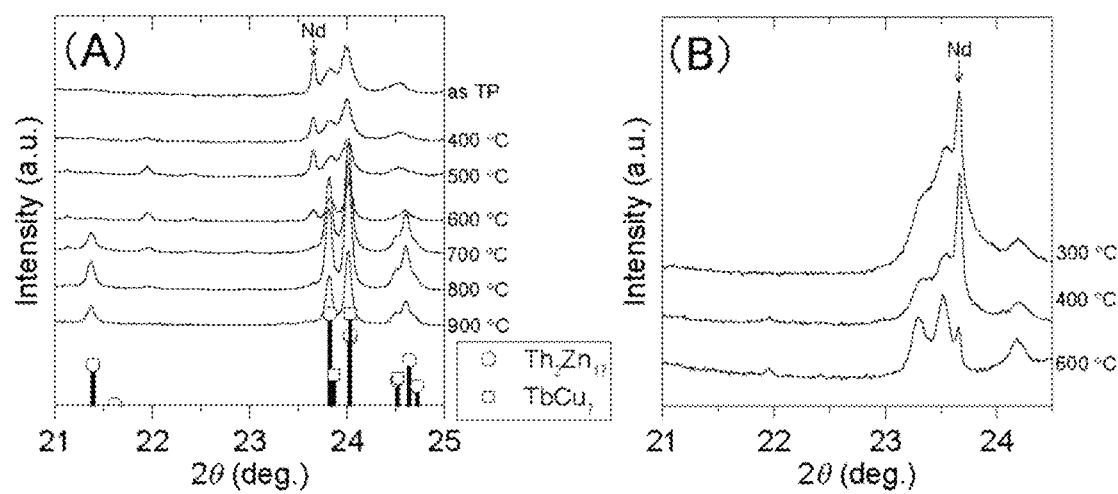
FIG. 3 shows the results of measuring XRD of (A) an $NdFe_x$ sample having a $TbCu_7$-type structure and (B) an $NdFe_xN_y$ sample as one embodiment of the present invention.

FIG. 3 (A) shows the XRD results of the NdFe$_x$ sample having a TbCu$_7$-type structure. The asTP is a sample that has been subjected to thermal plasma treatment. Thereafter, heat treatment was performed by holding at each temperature for 5 minutes in a vacuum of 10$^{-2}$ Pa or less from 400° C. to 800° C. at intervals of 100° C. in an infrared heating furnace, and the results are also shown in FIG. 3 (A). When the heat treatment temperature is less than 700° C., no superlattice peak peculiar to the Th$_2$Zn$_{17}$ structure appears in the vicinity of 21.4°. Therefore, it can be seen that the TbCu$_7$-type structure includes no Th$_2$Zn$_{17}$ structure. However, when the heat treatment temperature is 700° C. or more, a superlattice peak derived from the Th$_2$Zn$_{17}$ structure can be confirmed in the vicinity of 21.4°. Therefore, it can be seen that the powder includes the Th$_2$Zn$_{17}$ structure.

FIG. 3 (B) shows the XRD results of the NdFe$_x$N sample having the TbCu$_7$-type structure. FIG. 3 shows the results of heat treatment performed by holding at 300, 400, and 600° C. for 15 minutes in an infrared heating furnace under a nitrogen flow condition of 1 L/min. Under all conditions, a low angular shift of the peak derived from the TbCu$_7$-type structure was observed, and the volume was expanded by about 5.98 t 0.6% in all samples as compared with the NdFe$_x$ sample having the TbCu$_7$-type structure, which indicates that nitrogen atoms penetrated in the range of 1.0≤y≤2.0.

Figure 4:
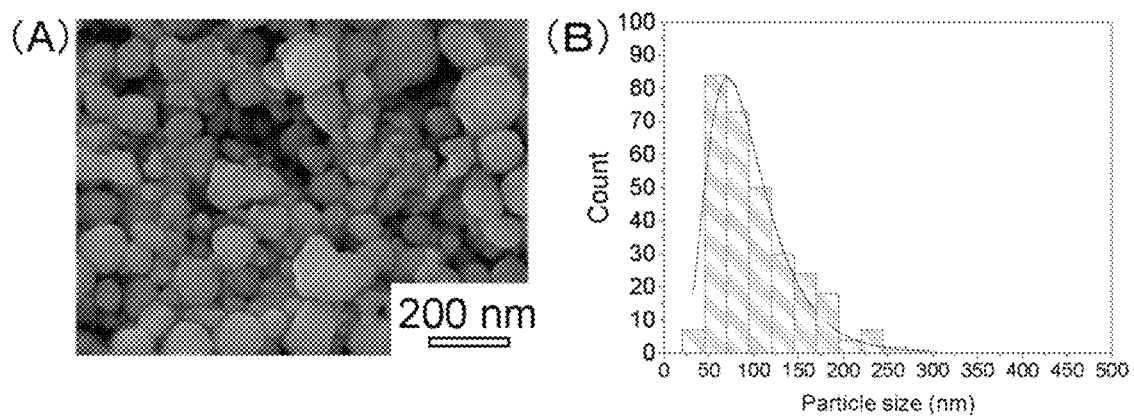
FIG. 4 is a histogram of particle sizes of (A) an $NdFe_x$ sample having a $TbCu_7$-type structure and (B) an $NdFe_x$ powder as one embodiment of the present invention.

FIG. 4 (A) is an SEM image of an NdFe$_x$ sample having a TbCu$_7$-type structure. FIG. 4 (B) is a histogram of particle sizes based on randomly selected 300 particles. This calculated the average particle size to be 96 nm.

Figure 5:
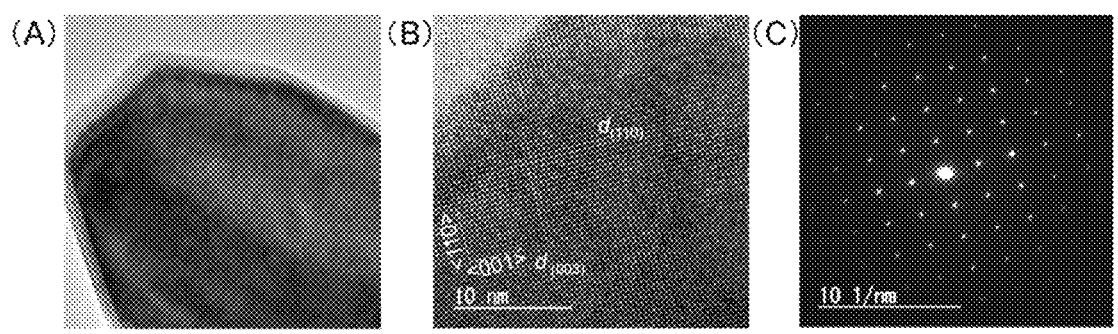
FIG. 5 is (A) a scanning transmission electron microscope image of $NdFe_x$ particles having a $TbCu_7$-type structure as one embodiment of the present invention, (B) a transmission electron microscope image of $NdFe_x$ particles, and (C) an electron beam diffraction image of (C) of (B).

FIG. 5 shows (A) a transmission electron microscopic image, (B) a high-resolution transmission electron microscopic image, and (C) an electron beam diffraction image of NdFe$_x$ particles having a TbCu$_7$-type structure. This result can confirm that the crystal is a single crystal.

From the EDX measurement, the particles shown in FIG. 5 (B) had an atomic ratio of Nd:Fe=9.95:90.05. For the observation, a field emission transmission electron microscope. JEM-2100F/HK (manufactured by JEOL Ltd.) was used.

Herein, this XRD was performed by using the Aichi Synchrotron BL5S2 at an energy of 14 keV. The powder was sealed in a quartz capillary having 300 μm in a glove box and then measurement was performed.

Example 2

Sm metal was heat-treated at 500° C. in a hydrogen atmosphere to be formed into SmH$_3$, and then SmH$_3$ pulverized to 100 μm or less and Fe having an average particle size of 3 μm purchased from Kojundo Chemical Laboratory were mixed at an atomic ratio of 2:3, and the mixed powder was used as a raw material powder. The thermal plasma process conditions are the same as in Example 1 described above.

Figure 6:
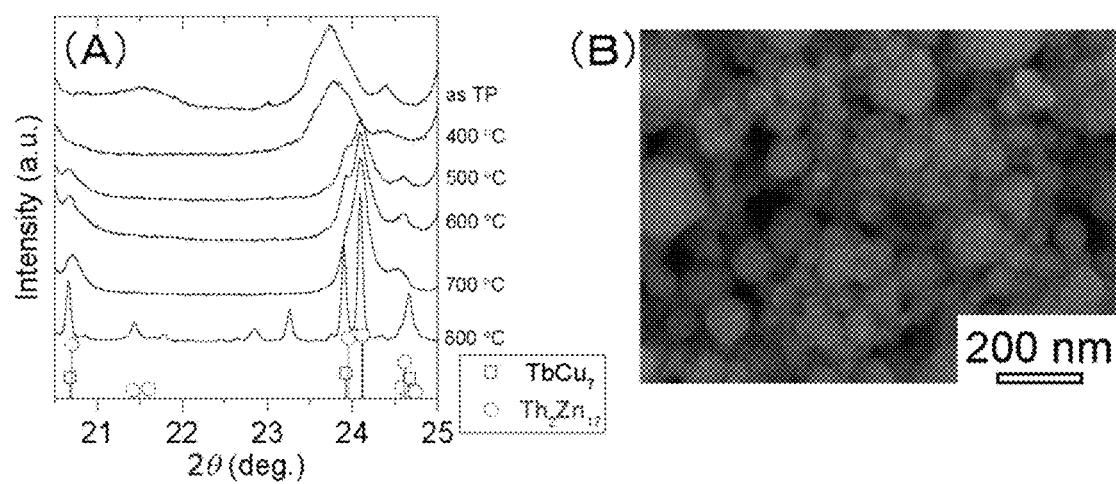
FIG. 6 is (A) an XRD measurement result and (B) an SEM image of a $SmFe_x$ powder having a $TbCu_7$-type structure as one embodiment of the present invention.

FIG. 6 (A) shows the XRD results of SmFe$_x$ particles having a TbCu$_7$-type structure. FIG. 6 (A) also shows the results of heat treatment performed in an infrared heating furnace from 400° C. to 700° C. in intervals of 100° C. by holding at each temperature for 5 minutes in an Ar gas flow. For asTP, at 400° C., the peak derived from the TbCu$_7$-type structure was shifted to the low angular side because a hydride was formed by hydrogen included in the raw material component during the thermal plasma treatment; however, at the heat treatment temperature of 500° C. or more, dehydrogenation proceeded, and a spectrum matching the peak position of SmFe$_x$ having the TbCu$_7$-type structure was obtained.

In addition, a supertattice peak peculiar to the Th$_2$Zn$_{17}$ structure that appears around 21.4° was not observed, and thus it can be seen that it is a TbCu$_7$-type structure; however, a superlattice peak derived from the Th$_2$Zn$_{17}$ structure can be confirmed around 21.4° at a heat treatment temperature of 800° C. or more.

As a result of heat-treating the SmFe$_x$ sample that had been heat-treated at 50° C. in an Ar gas flow for 5 minutes by holding the SmFe$_x$ sample at each of temperatures of 300, 400, and 600° C. for 15 minutes in an infrared heating furnace under a nitrogen gas flow condition of 1 L/min, a low angular shift of the peak derived from the TbCu$_7$-type structure was observed under all conditions, and the volume was expanded by about 6.05 t 0.5% in all samples as compared with the SmFe$_x$ sample having the TbCu$_7$-type structure, and thus it is found that nitrogen atoms penetrated in the range of 1.0≤y≤2.0.

Herein, this XRD was performed by using the Aichi Synchrotron BL5S2 at an energy of 14 keV. The powder was sealed in a quartz capillary having 300 μm in a glove box and then measurement was performed.

FIG. 6 (B) is an SEM image of a SmFe$_x$ sample having a TbCu$_7$-type structure. The average particle size was calculated to be 105 nm.

From the EDX measurement, one particle shown in FIG. 6 (B) had an atomic ratio of Sm:Fe=9.80:90.20, and the average value in the image of FIG. 6 (B) had an atomic ratio of Sm:Fe=9.71:90.29. For the observation, JSM-7800F (manufactured by JEOL Ltd.) was used.

Specific embodiments of the present invention have been illustrated and described, and it is apparent to those skilled in the art that various other modifications and changes can be made without departing from the spirit and scope of the present invention. Therefore, all such modifications and changes that are within the scope of the present invention are intended to be covered in the appended claims.

INDUSTRIAL APPLICABILITY

A rare earth anisotropic magnet material of the present invention is suitable for use in a permanent magnet with high characteristics, which are suitable for use in a wide range of fields such as electronics, information communication, medical, machine tool fields, and industrial and automobile motors. In recent years, permanent magnets with higher characteristics have been required particularly for the purpose of achieving widespread use of hybrid cars, energy saving in industrial fields, and improvement of power generation efficiency.

The invention claimed is:
1. A single crystal powder, represented by the following general formula:

$(R_{1-z}M_z)T_x$     [Chemical Formula 1]

having a metastable crystal structure of TbCu$_7$-type, and having an average particle size of 30 to 300 nm, wherein R is at least one element selected from the group consisting of Nd and Sm, M is at least one element selected from the group consisting of Zr, Y, and Ce, T is Fe or both Fe and Co, x is 7.0≤x≤10.0, and z is 0.0≤z≤0.3.

2. The single crystal powder according to claim 1, wherein R is Nd.

3. The single crystal powder according to claim 1, wherein R is Sm.

4. A permanent magnet material comprising the single crystal powder according to claim 1.

5. A permanent magnet material comprising the single crystal powder according to claim 2.

6. A permanent magnet material comprising the single crystal powder according to claim 3.

7. A method for producing the single crystal powder according to claim 1, the method comprising:
   using a mixed powder or an alloy powder of R, and T as a raw material powder; and evaporating a raw material metal powder,
   wherein R is at least one element selected from the group consisting of Nd and Sm,
   wherein M is at least one element selected from the group consisting of Zr, Y, and Ce, and
   wherein T is Fe or both Fe and Co.

8. A method for producing the single crystal powder according to claim 2, the method comprising:
   using a mixed powder or an alloy powder of Nd, M as a raw material powder; and evaporating a raw material metal powder,
   wherein M is at least one element selected from the group consisting of Zr, Y, and Ce, and
   wherein T is Fe or both Fe and Co.

9. A method for producing the single crystal powder according to claim 3, the method comprising:
   using a mixed powder or an alloy powder of Sm, M, and T as a raw material powder; and evaporating a raw material metal powder,
   wherein M is at least one element selected from the group consisting of Zr, Y, and Ce, and
   wherein T is Fe or both Fe and Co.

* * * * *